United States Patent [19]
Gould et al.

[11] Patent Number: 5,732,246
[45] Date of Patent: Mar. 24, 1998

[54] PROGRAMMABLE ARRAY INTERCONNECT LATCH

[75] Inventors: Scott Whitney Gould, South Burlington; Frank Ray Keyser, III, Colchester; Wendell Ray Larsen, Essex Junction; Brian Allen Worth, Milton, all of Vt.

[73] Assignee: International Business Machines Corporation, Armonk, N.Y.

[21] Appl. No.: 480,639

[22] Filed: Jun. 7, 1995

[51] Int. Cl.$^6$ .............................. G06F 9/455; G06F 17/50
[52] U.S. Cl. .................. 395/500; 364/578; 364/221.2; 364/232.3; 364/239; 364/276.2; 364/DIG. 1
[58] Field of Search ................ 395/500; 364/488–491

[56] References Cited

U.S. PATENT DOCUMENTS

| | | | |
|---|---|---|---|
| 4,063,080 | 12/1977 | Eichelberger et al. | 235/302 |
| 4,140,967 | 2/1979 | Balasubramanian et al. | 324/73 R |
| 4,177,452 | 12/1979 | Balasubramanian et al. | 340/166 R |
| 4,225,957 | 9/1980 | Doty, Jr. et al. | 371/15 |
| 4,404,635 | 9/1983 | Flaker | 364/481 |
| 4,441,075 | 4/1984 | McMahon | 324/73 R |
| 4,476,431 | 10/1984 | Blum | 324/73 R |
| 4,495,629 | 1/1985 | Zasio et al. | 377/70 |
| 4,553,236 | 11/1985 | Zasio et al. | 371/15 |
| 4,635,261 | 1/1987 | Anderson et al. | 371/25 |
| 4,684,830 | 8/1987 | Tsui et al. | 307/465 |
| 4,749,947 | 6/1988 | Gheewala | 324/73 R |
| 4,761,768 | 8/1988 | Turner et al. | 365/201 |
| 4,780,628 | 10/1988 | Illman | 307/465 |
| 4,782,283 | 11/1988 | Zasio | 324/73 R |
| 4,855,669 | 8/1989 | Mahoney | 324/73 R |
| 4,893,311 | 1/1990 | Hunter et al. | 371/22.5 |
| 4,980,889 | 12/1990 | DeGuise et al. | 371/22.3 |
| 5,047,710 | 9/1991 | Mahoney | 324/158 R |
| 5,068,603 | 11/1991 | Mahoney | 324/158 R |
| 5,218,245 | 6/1993 | Kohler et al. | 307/465 |
| 5,250,852 | 10/1993 | Ovens et al. | 307/272.2 |
| 5,257,223 | 10/1993 | Dervisoglu | 365/154 |
| 5,285,453 | 2/1994 | Gruodis | 371/27 |
| 5,291,079 | 3/1994 | Goetting | 307/465 |
| 5,298,805 | 3/1994 | Garverick et al. | 307/465 |
| 5,337,255 | 8/1994 | Seidel et al. | 364/489 |
| 5,386,154 | 1/1995 | Goetting et al. | 326/44 |

OTHER PUBLICATIONS

Wagner, P.T., "Interconnect Testing With Boundary Scan," International Test Conference, 1987, pp. 52–57.

*Primary Examiner*—Gary Chin
*Assistant Examiner*—Ayni Mohamed
*Attorney, Agent, or Firm*—Heslin & Rothenberg, P.C.

[57] ABSTRACT

A given interconnect of a programmable gate array includes a programmable repeater circuit that enables selective isolation and testing of a select block of configured circuitry within the programmable gate array. The programmable repeater circuit includes an input node coupled to a first portion of the given interconnect and an output node coupled to a second portion of the given interconnect. A selective buffer circuit selectively outputs a buffered output signal to the output node that is related to a logic state at the input node. A signal storage circuit is also connected to the input node for selectively storing the logic state received from the input node. In a further embodiment, the signal storage circuit comprises an LSSD register. A primary latch of the LSSD register receives data selectively either from the input node, in accordance with a first clock signal, or alternatively from a secondary serial input node, in accordance with a second clock signal. A secondary latch of the LSSD register is selectively coupled, per a third clock signal, to receive and latch therein latched data of the primary latch. Data representative of data latched within the secondary latch is provided at a secondary serial output, and selectively provided at the primary output node when enabled per a programmable enable signal. In yet a further embodiment, the LSSD register is part of a serial scan chain for selectively interfacing an interconnect boundary of the select block of the configured circuitry within the programmable gate array.

31 Claims, 12 Drawing Sheets

PROGRAMMABLE ARRAY INTERCONNECT LATCH

RELATED APPLICATION INFORMATION

This application relates to commonly owned concurrently or previously filed U.S. Patent Applications:

1. Ser. No. 08/459,579, now U.S. Pat. No. 5,631,578, BU9-95-025 (0406.150), entitled "PROGRAMMABLE ARRAY INTERCONNECT NETWORK";

2. Ser. No. 08/460,420, now U.S. Pat. No. 5,671,432, BU9-95-023 (0406.152), entitled "PROGRAMMABLE ARRAY I/O-ROUTING RESOURCE";

3. Ser. No. 08/459,156, now U.S. Pat. No. 5,652,529, BU9-95-024 (0406.149), entitled "PROGRAMMABLE ARRAY CLOCK/RESET RESOURCE"; and 4. Ser. No. 08/460,481, now U.S. Pat. No. 5,646,546, BU9-95-019 (0406.153), entitled "PROGRAMMABLE LOGIC CELL".

The section entitled "Description of the Preferred Embodiment(s)," and the drawings, from each of the above-referenced related U.S. Patent applications are hereby expressly incorporated herein by reference.

TECHNICAL FIELD

This invention relates in general to integrated circuit devices, and, more specifically, to programmable integrated circuit devices having a plurality of programmable logic cells and a programmable interconnection network. In particular, the present invention relates to the provision of programmable latches within certain interconnects of the programmable interconnection network.

BACKGROUND OF THE INVENTION

Programmable integrated circuits are known in the art and include Programmable Logic Devices ("PLDs"), Programmable Array Logic ("PALs"), and Programmable Logic Arrays ("PLAs"). Each of these programmable circuits provides an input AND logic plane followed by an OR logic plane. An output function can thus be calculated which is the sum of the products of the input terms. The logic planes are usually programmable such that the initial general layout of the planes may be customized for a particular application.

A more general approach to programmable circuits involves providing an array of distinct, uncommitted logic cells in a Programmable Gate Array ("PGA"). A programmable interconnect network is usually provided to interconnect the cells, and to provide data input to, and output from, the array. Customization or programming of the otherwise generally-designed logic cells and interconnect network is performed for a particular application. One such array is a Mask Programmable Gate Array ("MPGA"), wherein the configuration of the cells and the wiring network occurs when adding the final layers of metallization to an integrated circuit. A modified approach involves the use of laser-directed energy to customize the metallization pattern. Another such array is a Field Programmable Gate Array ("FPGA"), wherein the configuration can be performed by a user, in the "field". Such configuration may be effected by using electrically programmable fusible links, antifuses, memory-controlled transistors, or floating-gate transistors.

Once the programmable array is configured to provide a desired circuit, it may be desirable to isolate and test a specific module of the overall logic circuit. One method of testing the specific module comprises reconfiguring the programmable array with the specific module between select I/O pins of the programmable array. Test data is then passed through the specific module via the select I/O pins. However, it would be more desirable to isolate the specific module from the remaining logic circuitry by way of a programmable boundary internal to the configured programmable array without having to directly interface the specific module between the select I/O pins. Ideally, specific interconnects of the programmable interconnect network associated with a boundary of the specific module would be selectively opened and accessed for isolating and testing the specific module.

SUMMARY OF THE INVENTION

Accordingly, it is an object of the present invention to provide an improved programmable interconnect of an interconnect network of a programmable gate array.

It is a further object of the present invention to provide improved circuitry within interconnects of a programmable interconnect network of the programmable gate array for permitting isolation and testing of specific blocks of configured circuitry within the programmable gate array.

It is another object of the present invention to provide an improved apparatus and method for permitting boundary scan isolation and testing of select programmable resources of a field programmable gate array.

In one embodiment of the present invention, an integrated circuit has a plurality of programmable logic circuits and a programmable interconnect network for connecting the programmable logic circuits. A programmable interface circuit is connected within the programmable interconnect network. The programmable interface circuit includes at least one data input node and at least one data output node. A circuit is connected between the data input and data output nodes for selectively providing a buffered output signal to the data output node that is related to a logic state at the data input node. A signal storage circuit is also connected to the data input node for selectively storing the logic state received from the data input node.

In a further aspect of this embodiment of the present invention, the programmable interface circuit further comprises a secondary input node and a secondary output. The signal storage circuit comprises a selective storage device for selectively storing a logic state as received from either the data input node or the secondary input node. An additional circuit provides data representative of the stored logic state to the secondary output node.

In accordance with a further aspect of the present embodiment, the programmable interface circuit further comprises circuitry for selectively providing data representative of the stored logic state to the data output node.

In a preferred aspect of the present embodiment of this invention, a selective circuit selectively connects the signal storage circuit to either a control signal path or a test control signal path such that the signal storage circuit can be used either for testing or during operation, respectively, of the integrated circuit.

In a further aspect of the present embodiment of the invention, the signal storage circuit comprises an LSSD register latch. The LSSD register latch has a secondary input node for receiving serial input data and a secondary output node for sending out serial output data. Primary and secondary latches retain respective primary and secondary latched data. A first selective coupler is disposed between the data input node and the primary latch for selectively coupling primary data of the data input node to the primary latch in accordance with a first clock signal so as to capture the primary data as primary latched data. A second selective coupler is disposed between the secondary input node and the primary latch for selectively coupling serial input data of the secondary input node to the primary latch in accordance with a second clock so as to capture the serial input data as primary latched data. In addition, a third selective coupler is disposed between the primary latch and the secondary latch for selectively coupling the primary latched data of the primary latch to the secondary latch in accordance with a third clock. In so doing, the secondary latch data of the secondary latch is updated in accordance with the primary latched data. The secondary latched data of the secondary latch is provided at the secondary output node as serial output data. Preferably, the signal storage circuit further comprises a programmable output for selectively outputting an output signal representative of the secondary latched data to the data output node, wherein the data is selectively output in accordance with the programmable select signal.

In accordance with a second embodiment of the present invention, a method is provided for operating an integrated circuit. An integrated circuit is provided having a plurality of programmable logic circuits, a programmable interconnect network for connecting the programmable logic circuits, a programmable buffer for selectively buffering a signal within a given programmable interconnect, and a signal storage circuit of a first serial scan chain for selectively capturing and storing data of the given programmable interconnect. Select programmable logic circuits of the plurality of logic circuits are configured with select programmable interconnects to provide a configured logic circuit inclusive of the given programmable interconnect associated with the programmable buffer and the signal storage circuit. Known data is applied to the configured logic circuit whereupon the signal storage circuit is selectively operated for capturing data of the given programmable interconnect as effected by processing of the configured logic circuit. Thereafter, the captured data is scanned out of the first scan chain.

In an alternative aspect of this second embodiment of the present invention, the integrated circuit also includes a second signal storage circuit of a second scan chain for selectively applying the known data to the configuration logic circuit. Thus, in applying the known data to the configured logic circuit, the known data is first scanned into the second scan chain and subsequently transferred from the signal storage circuit of the second scan chain to the configured logic circuit.

In accordance with a third embodiment of the present invention, a method is provided for operating an integrated circuit having a plurality of programmable logic circuits, a programmable interconnect network for connecting the programmable logic circuits, a programmable buffer for selectively buffering a signal associated with a given programmable interconnect of the programmable interconnect network, and a signal storage circuit of a serial scan chain for selectively providing output data to said given programmable interconnect. A configured logic. Circuit is provided by configuring select programmable logic circuits of the plurality of logic circuits together with select programmable interconnects of said programmable interconnect network, inclusive of the given programmable interconnect associated with the programmable buffer and the signal storage circuit. Known data is serially scanned into the signal storage circuit via the serial scan chain associated therewith. The signal storage circuit is selectively operated for transferring the known data to the given programmable interconnect as input data to the configured logic circuit.

In a further aspect of this third embodiment of the present invention, the input data is processed by the configured logic circuit and output data as effected by the processing is then captured in a second signal storage circuit of a second serial scan chain.

In accordance with a fourth embodiment of the present invention, a programmable gate array comprises a plurality of programmable logic circuits and a plurality of programmable interconnects. A repeater latch circuit is provided within at least one programmable interconnect of the plurality of programmable interconnects. The repeater latch has first and second nodes coupled to respective first and second portions of the associated programmable interconnect. A programmable coupling circuit is disposed between the first and second nodes for selectively propagating a signal therebetween in accordance with a first select signal. An LSSD register is also disposed between the first and second nodes. The LSSD register has a primary input coupled to the first node for receiving primary data and a serial input for receiving serial data. A first latch captures, as input data, either primary data of the primary input, as effected by a pulse of a C-clock, or serial data of the serial input as effected by a pulse of an A-clock. A second latch latches data therein, as latched data, corresponding to the data captured by the first latch upon receiving a pulse of a B-clock. Serial output data, corresponding to the latched data of the second latch, is provided at a serial output of the LSSD register. A programmable primary output selectively provides to the second node primary output data corresponding to the latched data. The primary output data is output to the second node when the programmable primary output is enabled per a second select signal.

In a further aspect of this fourth embodiment of the present invention, the programmable coupling circuit further comprises a pass gate disposed between the first and second nodes. The pass gate is selectively enabled in accordance with a third select signal.

In a preferred aspect of this fourth embodiment of the present invention, a plurality of memory cells are associated with respective programmable resources of the programmable gate array. A first memory cell of the plurality of memory cells is associated with the programmable coupling circuit for providing the first select signal in accordance with stored data thereof. A second memory cell of the plurality of memory cells is associated with the programmable primary output of the LSSD register for providing the second select signal in accordance with stored data thereof.

In a further aspect of this fourth embodiment of the present invention, the LSSD register is one of a plurality of LSSD registers of a serial scan chain sharing in common respective A, B, C-Clocks and having independent select lines for respective programmable primary outputs.

In yet another aspect of this fourth embodiment of the present invention, a programmable selector is provided for alternatively coupling either functional clock lines or test clock lines to the LSSD register. Accordingly, the LSSD register may be clocked by functional clocks during functional operation of the associated logic circuits of the programmable gate array, or alternatively clocked by test clocks during testing of the programmable gate array.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

DESCRIPTION OF THE PREFERRED EMBODIMENT(S)

Figure 1:
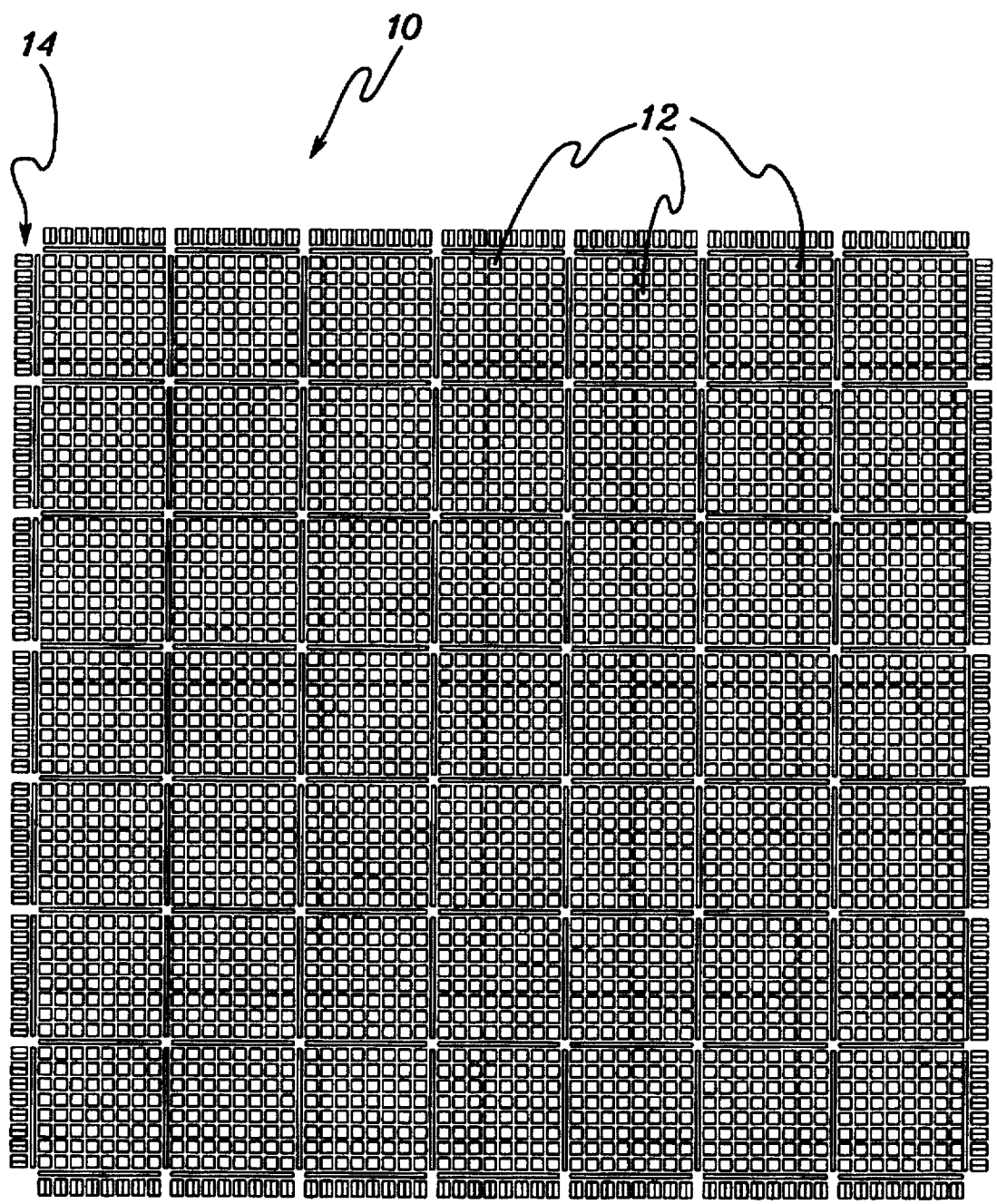
FIG. 1 illustrates a programmable gate array having a plurality of programmable logic cells arranged therein.

With reference to FIG. 1, there is shown a layout of a programmable gate array 10 comprising a plurality of logic cells. In this particular embodiment, the plurality of programmable logic cells comprises a 56×56 array of logic cells divided into sectors 12. Each sector 12 is defined by an 8×8 group of logic cells. Also depicted are input/output pins 14 along the perimeter of the array which may be used for data input and output. In addition, certain pins may be dedicated for use as clock pins, reset pins, or for configuration pins for programming the programmable resources of the array 10. The input/output portion of the array can be implemented according to the above-incorporated portions of the U.S. Patent Application entitled "PROGRAMMABLE ARRAY I/O—ROUTING RESOURCE."

Figure 2:
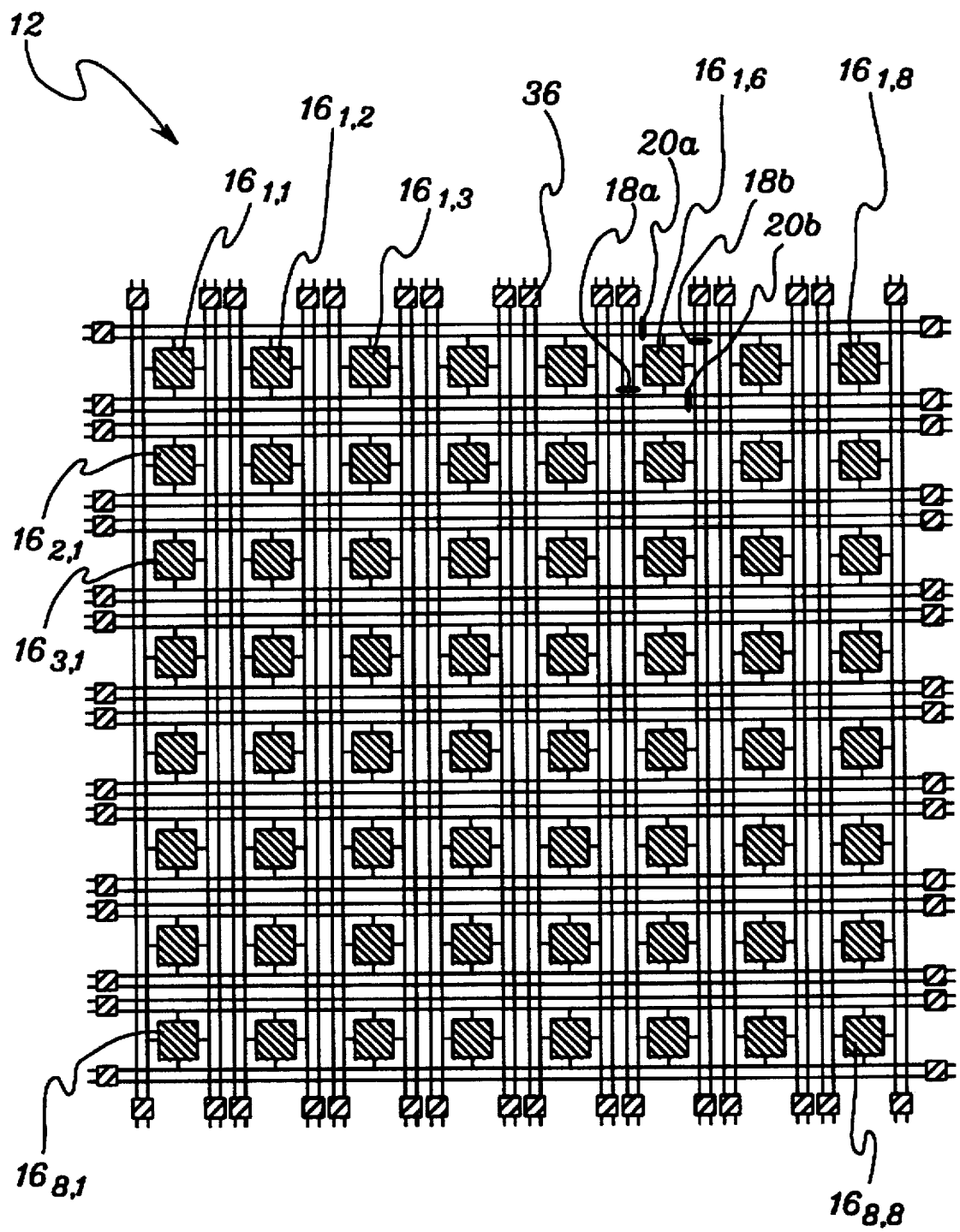
FIG. 2 depicts a sector portion of a programmable gate array having a plurality of programmable logic cells arranged therein, and a programmable interconnect network for selectively connecting the logic cells.

With reference to FIG. 2, there is shown a single sector 12 of programmable logic cells comprising logic cells $16_{1,1}$ to $16_{8,8}$. Logic cell $16_{1,6}$, is shown surrounded by vertical interconnect conductors 18a and 18b, and horizontal interconnect conductors 20a and 20b. Respective horizontal and vertical interconnect conductors are positioned between the associated rows and columns of the array and provide connections between any two logic cells in the array and the input/output pins. The interconnect conductors, which may be referred to alternatively as buses, together form the overall interconnect network of the programmable array. In addition, bus turns (not shown) may be employed to provide programmable interconnections between a specified vertical and a specified horizontal interconnect conductor. The interconnect network can be implemented according to the above-incorporated portions of the U.S. Patent Application entitled "PROGRAMMABLE ARRAY INTERCONNECT NETWORK."

Figure 3:
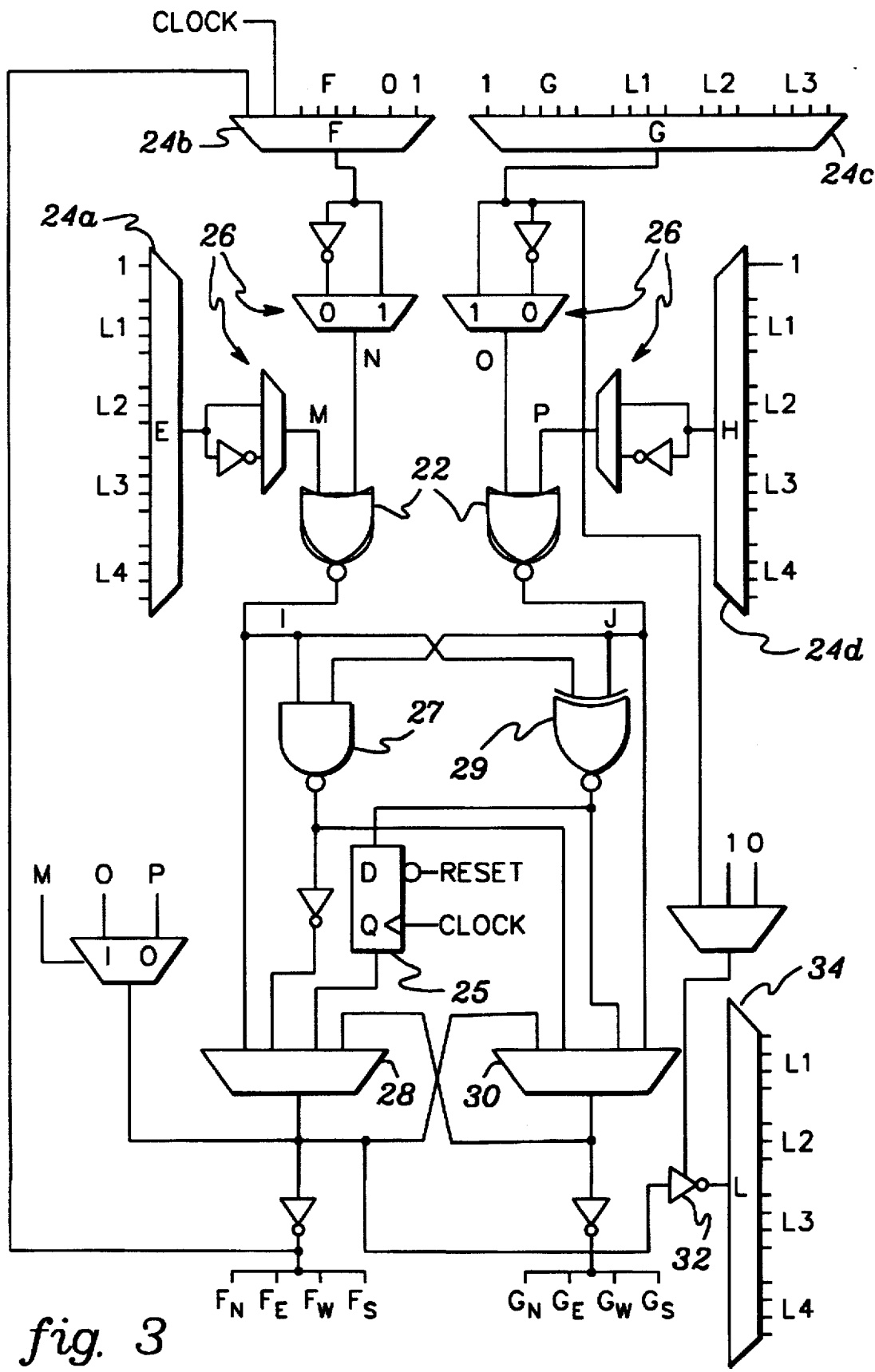
FIG. 3 is a block diagram illustrating programmable logic devices and interconnects of a logic cell.
Figure 4:
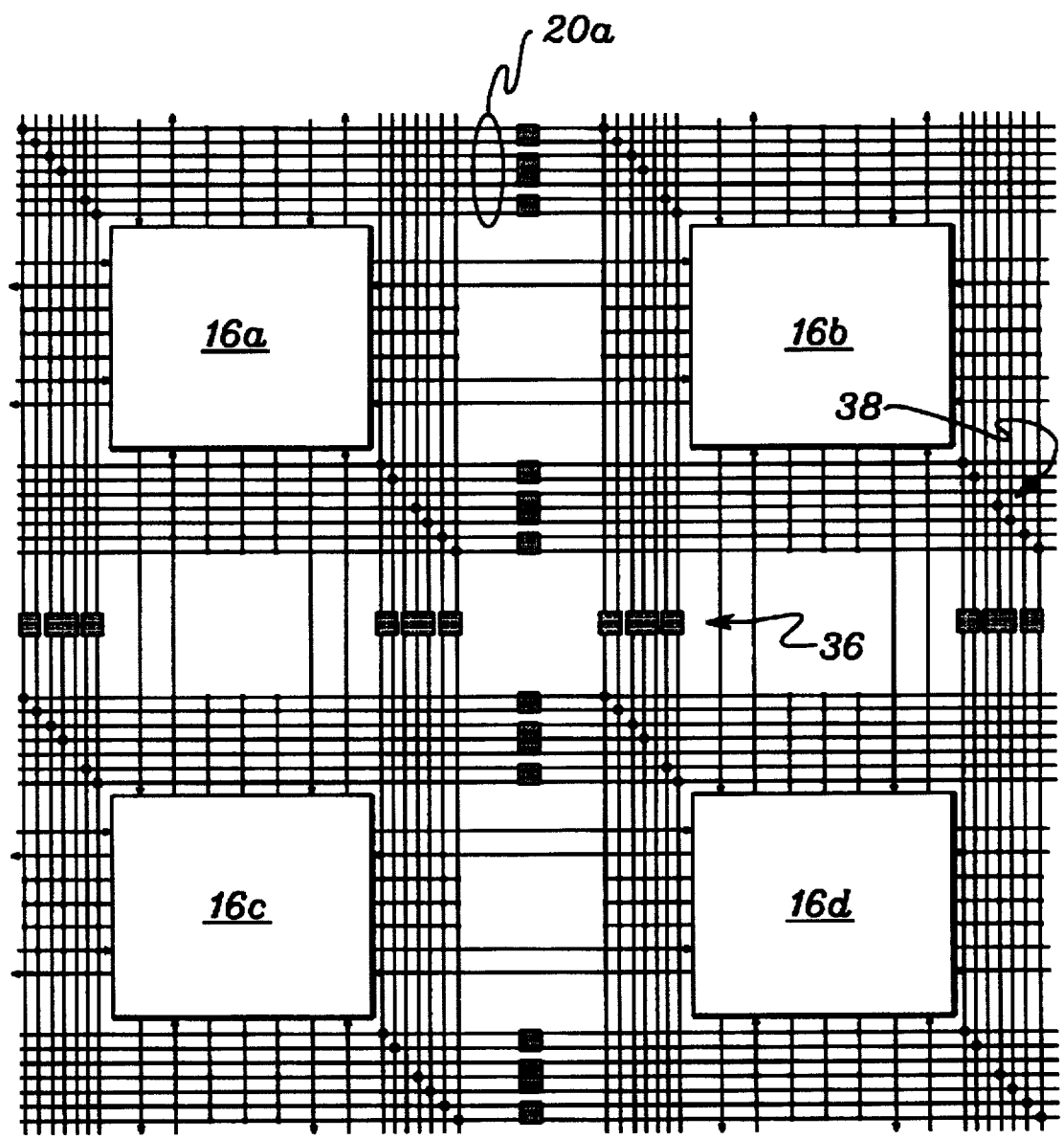
FIG. 4 illustrates four logic cells and their associated bussing and bus repeaters at the boundary of four separate sectors.
Figure 5:
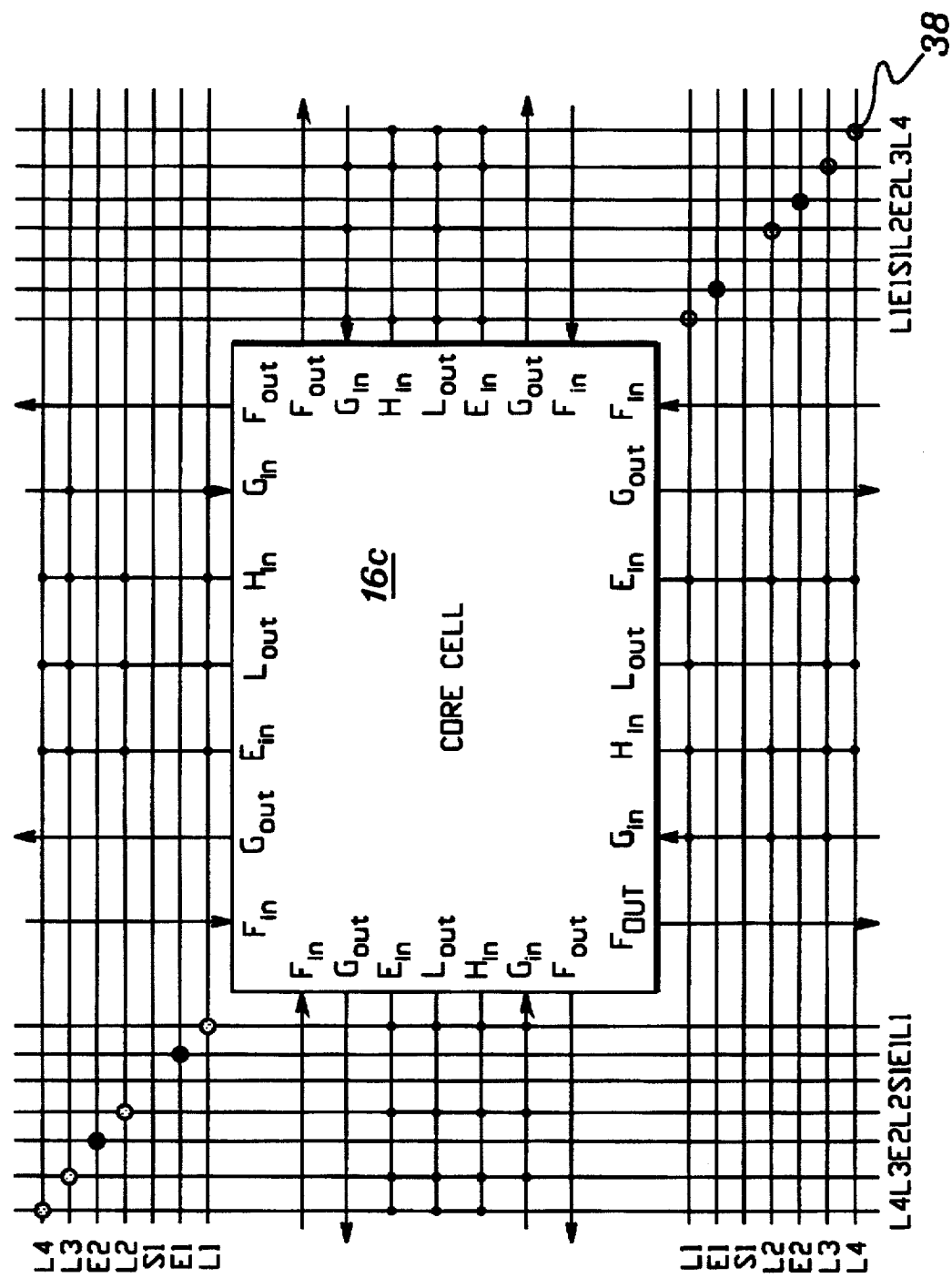
FIG. 5 illustrates a single logic cell of FIG. 4 together with associated surrounding bussing.

Each logic cell 16, with reference to FIGS. 3, 4, and 5, comprises a plurality of logic devices and internal interconnects. Programmable input multiplexers 24a–24d, receive a plurality of inputs from respective local buses L1,L2,L3,L4 surrounding the logic cell. In addition, some of the inputs to the multiplexers provide direct connections F,G to neighboring logic cells or provide coupling to clock, feedback and logic 1 or 0 signals.

Each input multiplexer has select lines driven by programmable bits of a static RAM for selecting which inputs to couple to the internal logic of the logic cell 16. Programmable input multiplexer 24a has 16 inputs and accordingly requires 4 programmable bits for selecting which one of the 16 inputs to pass forward to its output E. Programmable input multiplexer 24b is configured in accordance with associated programming bits for configuring the multiplexer to select one of the 8 inputs to pass forward to its output F. Programmable input multiplexer 24c has 16 inputs along with multiplexer 24d, accordingly, each requires 4 configuration bits.

The output from each multiplexer is sent to respective NAND/NOR logic devices 22, either directly without inversion, or indirectly with inversion, in accordance with the programming state of associated inverters 26. The logic of the programmable NAND/NOR gates 22 is determined in accordance with their associated configuration data. The outputs I,J from logic devices 22 are coupled to additional logic devices 27,29 and multiplexers 28,30. Flip/flop 25 receives a D input signal from logic device 29 and associated reset-and clock signals.

Output multiplexer 28 has four inputs: one from output I of logic device 22, one from logic device 27 via an inverter, one from flip/flop 25, and another from the output of multiplexer 30. Multiplexer 28 is configured in accordance with its configuration data and has an output coupled to the programmable output multiplexer 34 via tri-state buffer 32. The output of multiplexer 28 provides the direct connections F to neighboring logic cells at the north, east, west, and south sides. Multiplexer 30 has four inputs one from output J of logic device 22, two others from logic devices 29 and 27, and another from the output of multiplexer 28. The output of multiplexer 30 provides the direct connections G to the neighboring logic cells via an inverting buffer.

Pass gate multiplexers are employed as the input and output multiplexers for providing the logic cell's interconnects to the local buses. The multiplexers are controlled by static random access memory (SRAM) cells. The SRAM cells are directly or indirectly (through decoders) tied to gates of pass gates within the pass gate multiplexers thus controlling the states of the pass gates. For example, logic cell 16a comprises a programmable input multiplexer 24a which controls the E input connections at the various sides of the logic cell. In this particular embodiment, a single connection is routed from each potential bus into the source/drain combination of a transmission gate, and the drain/source combination of the transmission gate is routed to the input node of the logic cell. Sixteen such transmission gates may be found in a 16:1 pass gate multiplexer. Software and decoding logic ensure that only one particular pass gate is connected to any single input node.

Output multiplexer 34 has 16 outputs to associated local buses L1–L4 at the various sides of the logic cell. The output signal from tri-state buffer 32 is selectively coupled to one of the 16 outputs in accordance with the multiplexer's configuration bits. Further description of the internal logic and interconnects of logic cell 16 can be obtained according to the above incorporated portions of U.S. Patent Application entitled "PROGRAMMABLE LOGIC CELL".

As shown in FIG. 4, programmable bus turns 38 are provided at two of the diagonally disposed corners of each logic cell for enabling coupling of vertical buses to horizontal buses for all buses except the super bus. The configuration data for configuring the programmable bus turns between bus lines surrounding each logic cell 16 is included in the associated wiring configuration data of the given logic cell.

With reference to FIGS. 4 and 5, horizontal and vertical buses surround each logic cell 16 within the field programmable gate array. The buses comprise four local buses L1,L2,L3,L4, two express buses E1,E2 and one super bus S1. At the boundary of each sector, e.g. every 8 logic cells, repeaters 36 are interposed in the bus lines for providing switching between the local, express and super bus lines, and for buffering signals of the buses across the various sectors of the field programmable gate array. In addition, certain repeater groups include repeater latches for enabling selective capture of data from, and selective application of data to, associated local buses. Each repeater of a repeater group is programmable by associated configuration data to provide one of a plurality of repeater configurations.

Figure 6:
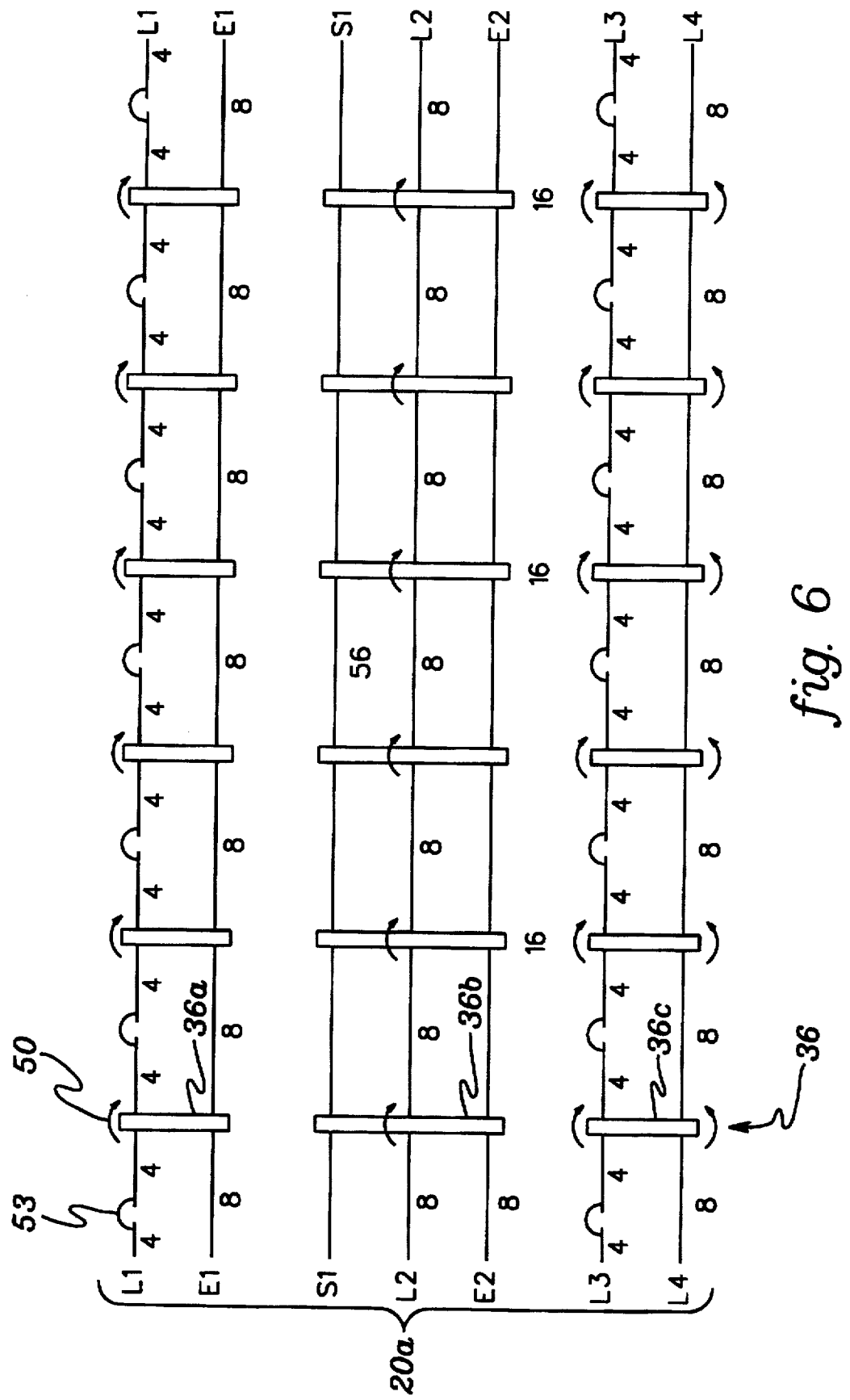
FIG. 6 is a block diagram illustrating repeater and jumper circuits of programmable bussing interconnects along a row of logic cells within a programmable gate array.
Figure 7:
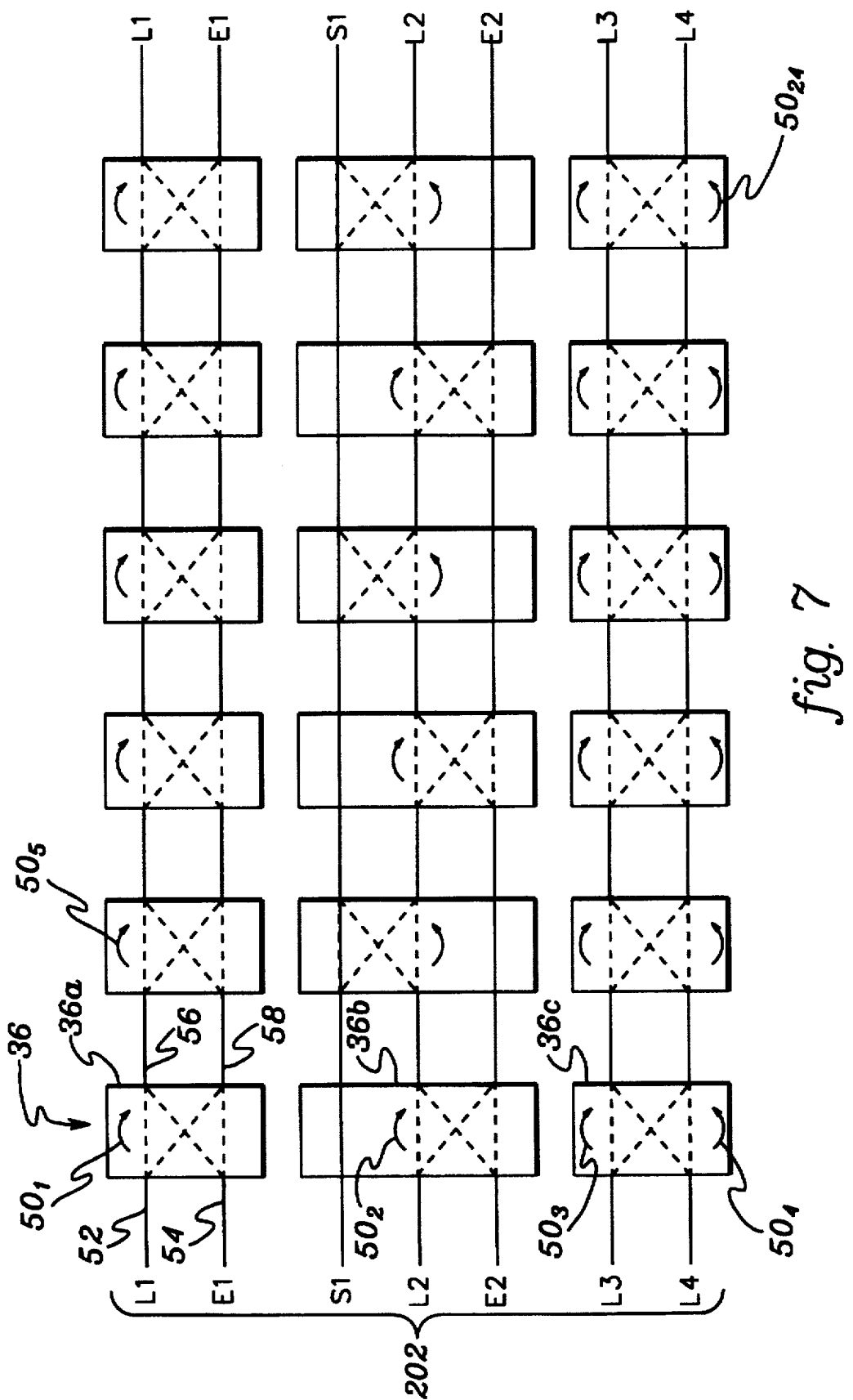
FIG. 7 provides a more detailed block diagram illustrating configuration options for the repeater circuits of FIG. 6.

A group of buses associated with one side of a row of core cells within a programmable gate array is depicted in FIGS. 6 and 7. A repeater circuit, such as repeater 36a, is associated with local bus L1 and express bus E1 at an interval of every eight core cells, at each sector boundary. In addition, local bus L1 includes jumpers 53 which enable selective division of the local bus into smaller bus segments. Repeater latches 50 (represented by arrows) are provided in parallel with each repeater circuit associated with the local buses. Repeater latch $50_1$, for example, comprises a LSSD register coupled between portion 52 and portion 56 of local bus L1. Likewise, similar repeater latches $50_2$, $50_3$, $50_4$ are shown associated with local buses L2, L3 and L4 respectively within repeater circuits 36b and 36c.

Figure 8:
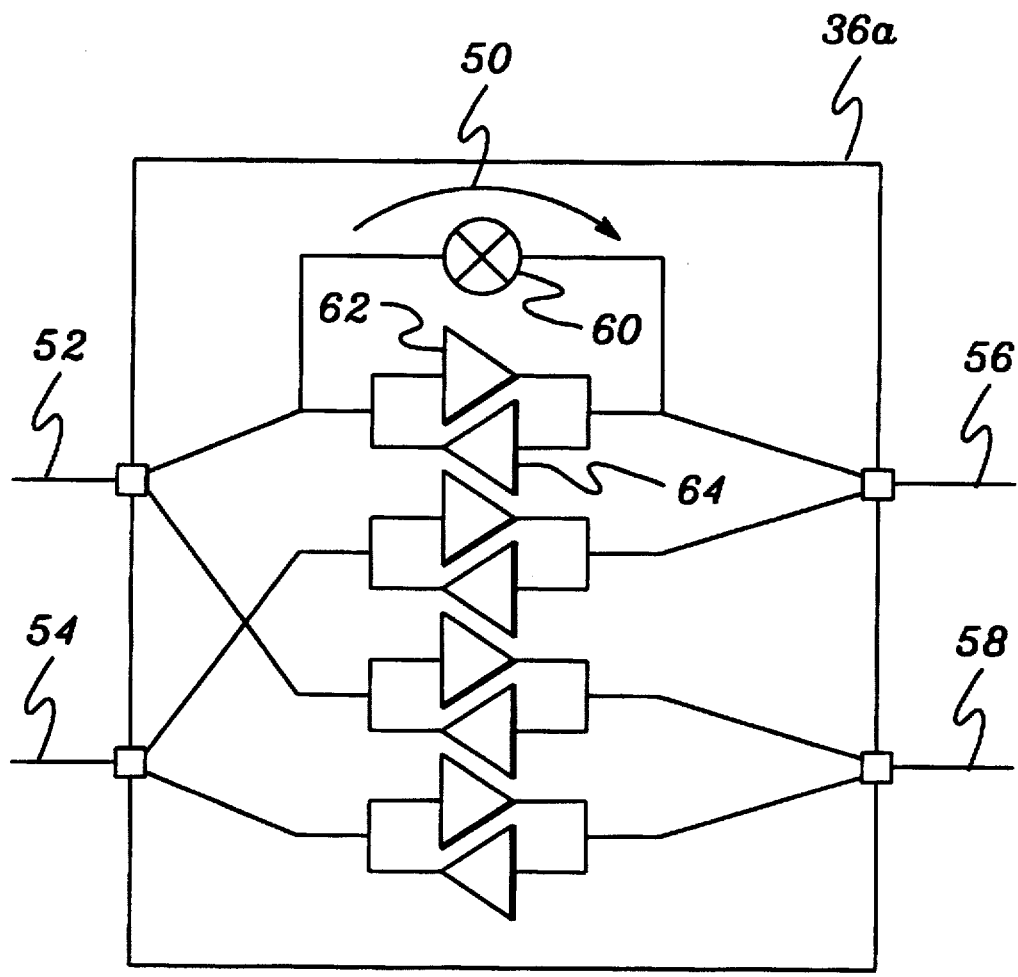
FIG. 8 is a functional block diagram of a repeater circuit having a repeater latch in accordance with the present invention.

With reference to FIG. 7, the dashed lines interconnecting various nodes of the repeater circuits, for example repeater circuit 36a, represent the possible buffer configurations between each of four nodes 52,54,56,58. Various programmable tri-state buffers 62,64 (with-reference to FIG. 8) included within repeater circuit 36a enable a variety of configuration possibilities. Each of the row 20 and column 18 buses within the field programmable gate array comprise a topology corresponding to row buses 20a (FIG. 2).

Figure 9:
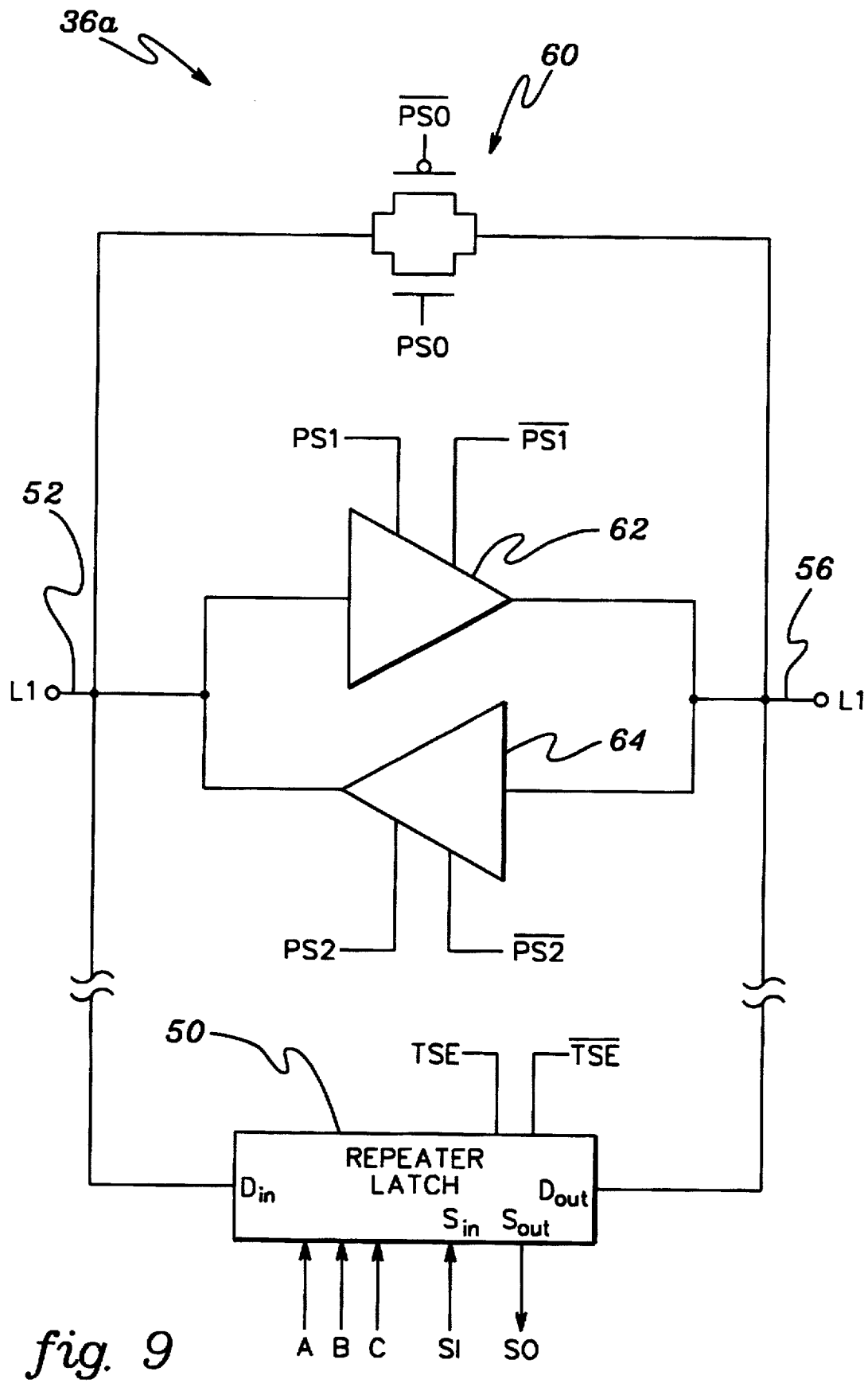
FIG. 9 is a partial block diagram representing in more detail some of the elements of the repeater of FIG. 8.

FIG. 9 shows in greater detail some of the programmable resources associated with repeater 36a. Pass gate 60 comprises two FET devices coupled with respective channels between nodes 52 and 56. The gates of the FETs of pass gate 60 are enabled via a select signal PS0 (and the compliment thereof). Tri-state buffer 62 has its input coupled to node 52 and its output coupled to node 56. The tri-state enable of buffer 62 is coupled to receive a second select signal PS1. A second tri-state buffer 64 is coupled in opposing direction between nodes 52 and 56 with its tri-state enabled receiving a third select signal PS2.

Repeater latch 50 (with reference to FIGS. 9 and 10) has a primary input $D_{in}$ for receiving input data from node 52 of local bus L1. A primary output $D_{out}$ of repeater latch 50 is coupled to node 56 of local bus L1. Secondary inputs and secondary outputs, $S_{in}$ and $S_{out}$ respectively, are provided for receiving and sending serial data of a serial scan chain, within which repeater latch 50 is incorporated. Repeater latch 50 has three clock inputs for receiving A, B, and C-clocks that enable LSSD operation of the repeater latch. A tri-state enable of the repeater latch is coupled to receive a tri-state enable signal TSE (and the compliment thereof) for enabling the repeater latch to provide data to its primary output $D_{out}$.

Figure 10:
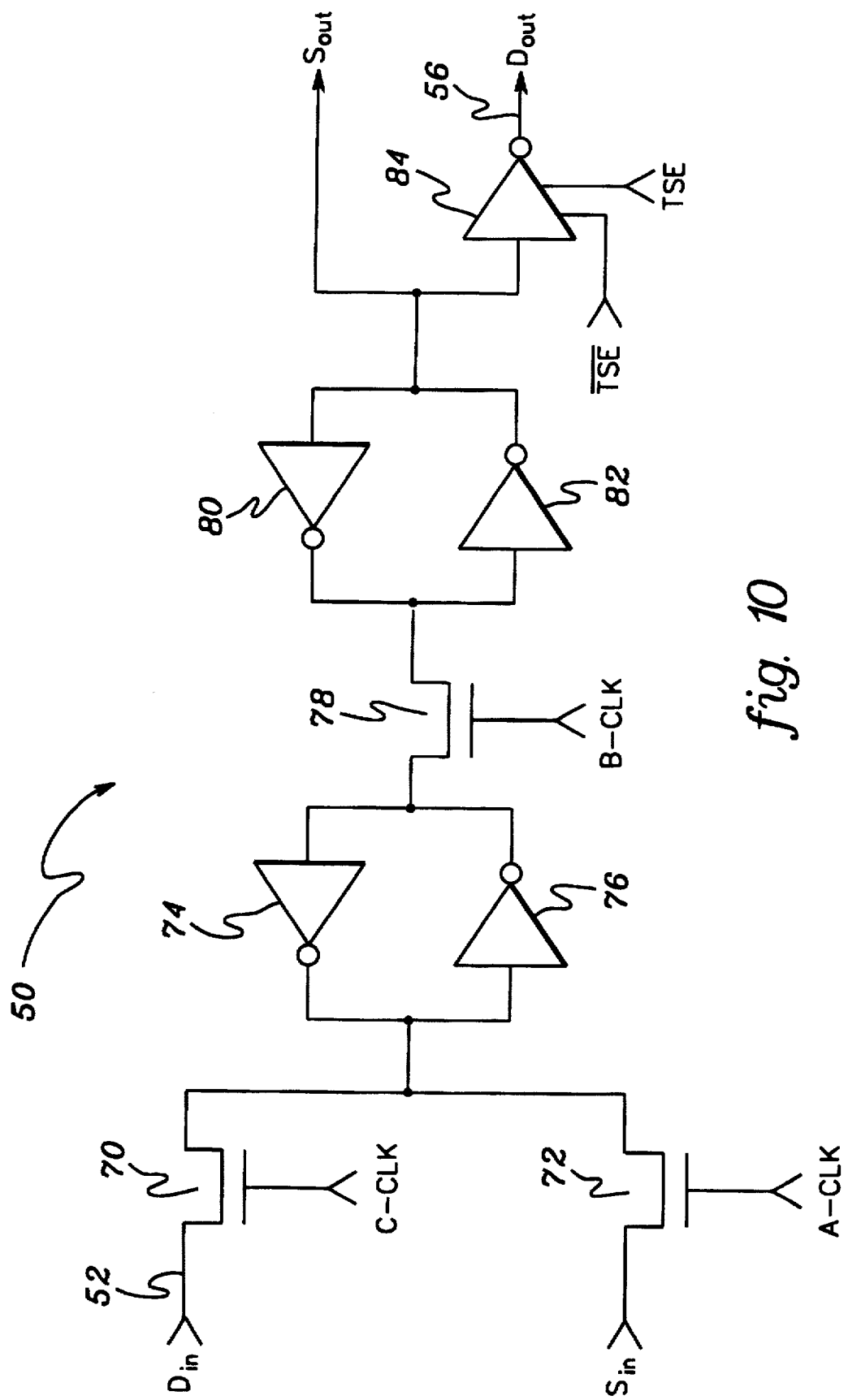
FIG. 10 is a schematic diagram of a repeater latch.

FIG. 10 is a schematic diagram representative of repeater latch 50. Passgates 70 and 72 provide selective coupling of primary input $D_{in}$ and secondary input $S_{in}$, respectively, to a first latch comprising inverters 74 and 76. Pass gate 78 is disposed between first latch 74,76 and a second latch comprising inverters 80 and 82. An output of the second latch 80,82 is fed to secondary output $S_{out}$ and also to the input of tri-state inverter 84. The output of tri-state inverter 84 drives the primary output $D_{out}$ for sending out data of the second latch to node 56 when enabled by tri-state enable signal TSE.

Figure 11:
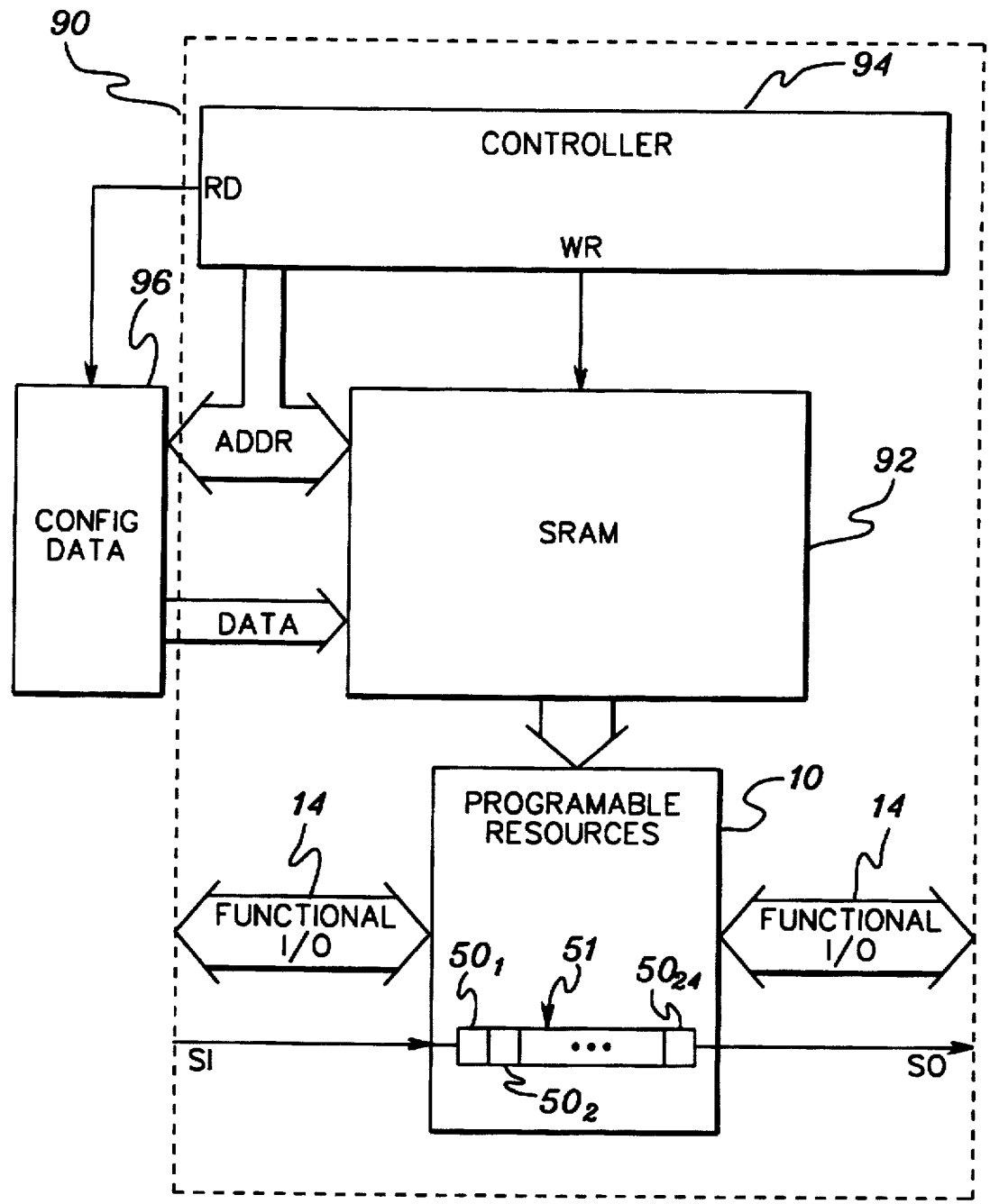
FIG. 11 is a block diagram of a programmable gate array interfaced with external circuitry for receiving configuration data.

To input serial data within a serial scan chain, for example serial scan chain 51 of FIG. 11, repeater latch 50 receives a clock pulse at the A-clock input. The A-clock pulse is applied to the gate of NFET 72 for enabling data of secondary input $S_{in}$ to be transferred to first latch 74,76. Alternatively, to capture data of primary input $D_{in}$, a C-clock pulse is applied to the gate of NFET 70 in order to transfer data from the primary input $D_{in}$ to first latch 74,76. To shift data from the first latch to the second latch, a B-clock pulse is applied to the gate of NFET 78, so as to update latched data of the second latch 2 in accordance with the data captured within the first latch. To output the latched data of the second latch to primary output $D_{out}$, the configuration data for repeater latch 50 is programmed to provide tri-state enable signal TSE for enabling tri-state inverter 84. In an alternative aspect, an invertor (not shown) is provided in the primary data path associated with primary input $D_{in}$ for avoiding an overall polarity inversion of data propagating from the primary input to the primary output. However, in a present embodiment of the invention, synthesis software for generating circuit configurations can accommodate a polarity inversion between the primary input and the primary output, as caused by the single tri-state inverter 84.

Applicants note that the schematic diagram of FIG. 10 represents merely one embodiment of an LSSD type latch register capable of being provided within the present invention. Other LSSD registers might also be employed so long as a programmable tri-state output is included for selectively coupling data of the second latch to a primary output $D_{out}$ associated with a distribution interconnect of the programmable gate array. As employed in this disclosure, LSSD refers to Level Sensitive Scan Design. Known LSSD techniques and circuitry include those as taught by: Eichelberger, U.S. Pat. No. 3,783,254 entitled "Level Sensitive Logic System," assigned to the assignee of the present invention; and R. W. Bassett et al., IBM Journal of Research & Development, Vol. 14, No. 2/4, March/May 1990, entitled "Boundary-Scan Design Principles for Efficient LSSD ASIC Testing."

Figure 12:
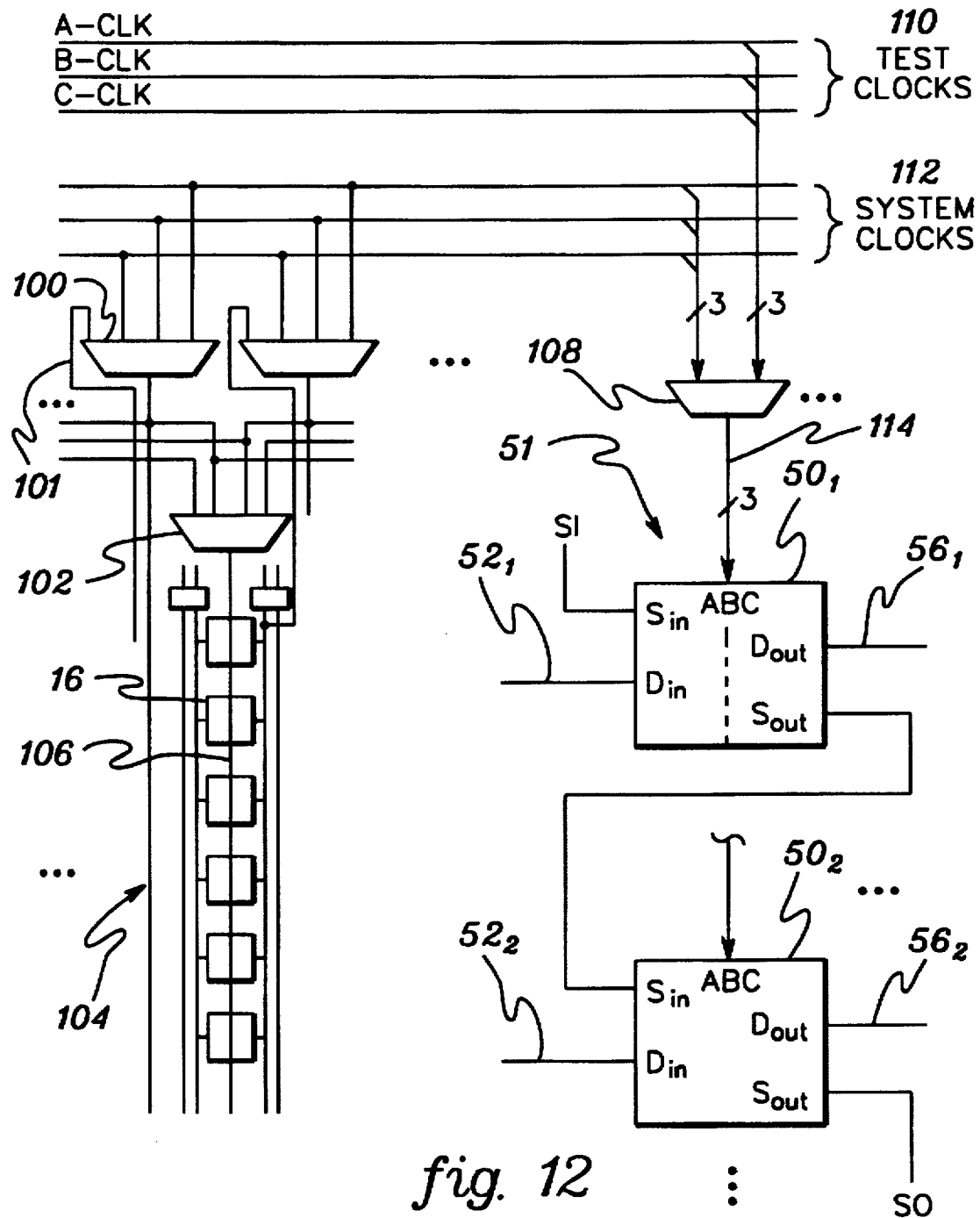
FIG. 12 provides a block diagram illustrating repeater latches of a scan chain selectively coupled for receiving either test clocks or system clocks.

With reference to FIGS. 7, 11 and 12, the plurality of repeater latches, in a preferred embodiment of the present invention, are configured in a serial scan chain 51 with respect to one another. The serial scan chain enables scanning of data serially into and out of the respective repeater latches. Each of the sequential repeater latches, for example repeater latch $50_1$, have respective serial outputs $S_{out}$ connected to the serial input $S_{in}$ of the subsequent repeater latch, for example, $50_2$. The serial input $S_{in}$ of the first repeater latch $50_1$ of scan chain 51 provides the scan input SI for scan chain 51. The serial output $S_{out}$ of the last repeater latch $50_{24}$ of the scan chain provides the scan output SO for the scan chain 51. Each of the repeater latches within the scan chain 51 share in common A, B, C clock inputs for receiving respective A, B, C-clocks for LSSD operation thereof. In contrast, each of the tri-state inverters providing the primary output $D_{out}$ of the associated repeater latches is allocated a unique memory cell of configuration memory 92. Accordingly, each tri-state inverter of the associated repeater latches is enabled independently per its own tri-state enable signal, as provided in accordance with the configuration data within its associated memory cell.

In a preferred embodiment of, the present invention, repeater latches are strung in separate parallel scan chains within respective row buses 20. Similarly, additional repeater latches are strung in separate parallel scan chains within respective vertical column buses 18 (which buses are as shown in FIG. 2). Preferably, the scan out SO and scan in SI of the respective scan chains are selectively multiplexed (not shown) from amongst the functional lines of the programmable gate array to the respective I/O ports 14 proximate the associated rows and columns of the programmable gate array.

In operation, a select group of logic cells 16 within the programmable gate array are configured and interconnected in accordance with a desired logic circuit. Each interconnect associated with a boundary of the configured logic circuit includes an associated repeater latch 50. Preferably, the interconnect inputs of the configured logic circuit are crossed by repeater latches of an associated first scan chain 51 (of FIG. 12) for permitting application of serially scanned input data to the inputs of the configured logic circuit while interconnect outputs of the configured logic circuit are crossed by repeater latches of a second scan chain (not shown). When the scan inputs SI and scan outputs SO of the respective scan chains are shared with other functional lines at the I/O ports of the programmable gate array, appropriate programming is required for configuring the associated dual use I/O ports for accessing the scan inputs and scan outputs of the respective first and second scan chains.

Once appropriately configured, a test vector is scanned into the first scan chain by operating respective A,B clocks, while the tri-state buffers 62,64 and passgates 60 of the associated repeater circuits are disabled. After the test vector has been scanned into the first scan chain, the tri-state inverter 84 of each repeater latch of the first scan chain is enabled for applying the test vector to the inputs of the configured logic circuit. After appropriate processing by the configured circuit, data outputs, as effected by the configured circuit, are captured into first latches of associated repeater latches of the second scan chain by appropriate operation of the C-clock. After capturing the output data effected by the configured logic circuit, the captured data is scanned out of the second scan chain by operating respective A,B clocks. The resulting data scanned out is then analyzed and compared to predetermined expected data in order to determine proper functionality of the configured logic circuit.

In the operation described above, the interconnects of the configured logic circuit were opened for isolating the configured logic circuit from the remainder of the programmable gate array. Test data was then presented to the configured logic circuit and results data obtained therefrom via the boundary scan chains. Accordingly, the configured logic circuit is examined independently of the remainder of the programmable gate array.

Figure 13:
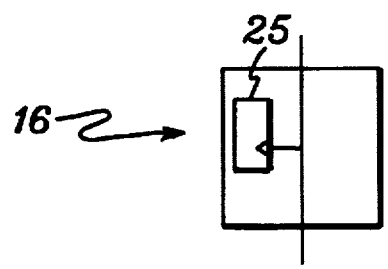
FIG. 13 is a diagram showing a latch of a logic cell coupled to a clock line.

With reference to FIG. 12 and 13, each column of each sector has a distribution network for distributing clock and reset signals to the flip/flops 25 of logic cells 16. Column clock line 106 receives a clock signal from the output of an associated column clock multiplexer 102 and distributes this clock signal to the flip/flop 25 of each logic cell 16 of a given column of a given sector. Multiplexer 102 is configured for selecting one clock signal from a clock signal of its own column or of a column up to two columns away. Similar circuitry and signal lines are provided for distributing reset signals to the flip/flops 25 of the logic cells of the various columns.

Associated with each column-of the field programmable gate array, spanning multiple sectors, are global column clock lines 104 which distribute clock signals from associated global column multiplexers 100. Global multiplexer 100 selectively couples one clock, of various system clocks 112 and an associated internally generated clock 101, for driving the respective global column clock line 104. Further information regarding configuration and programming of the clock and reset networks within the field programmable gate array can be obtained from the above-incorporated portions of the U.S. Patent Application entitled "PROGRAMMABLE ARRAY CLOCK/RESET RESOURCE."

In an alternative embodiment of the present invention, multiplexer 108 (as shown in FIG. 12) selectively couples system clocks, of operational control signal paths 112 or test clocks of test control signal paths 110 to the A,B,C inputs 114 of repeater latches 50 of scan chain 51. Accordingly, repeater latches $50_1, 50_2 \ldots$ may be employed during testing of the programmable gate array with appropriate clocking provided by the A,B,C-clocks of test clocks 110. Alternatively, the repeater latches $50_1, 50_2 \ldots$ may be employed together with other logic cells 16 during functional operation of the programmable gate array, latching and processing data per appropriate clocking as provided by system clocks 112.

Generally, when the repeater latches are employed functionally with other logic cells 16, only the C and B clock inputs of the repeater latches are clocked while the tri-state inverters 84 of the repeater latches are enabled for applying latched data thereof to the associated interconnects. In addition, it is possible to generate the two separate clocks for the C and B inputs from a single clock. A non-inverted representation of the single clock is applied to the C inputs of the repeater latches while the B inputs of the repeater latches receive an inverted representation of the single clock. To provide such operation, multiplexer 108 would have two output lines 114 coupled to the B and C inputs of repeater latches 50, two inputs of the multiplexer would be coupled to the B and C clocks of test clocks 110 and two alternative inputs would be coupled to associated clock lines of system clocks 112. The two associated clocks of the system clocks 112, as coupled to the alternative inputs of the multiplexer, could be provided by a single clock, wherein a non-inverted signal thereof is coupled to one clock line and the other clock line is driven by the same signal via an inverter (not shown).

Various technologies are known to those skilled in the art to provide array programmability. Mask programming techniques include customizing the deposition of the final layers of the metallization of an otherwise generally designed integrated circuit (see, for example U.S. Pat. No. 3,993,919 to Cox et al. entitled "PROGRAMMABLE LATCH AND OTHER CIRCUITS FOR LOGIC ARRAYS," Nov. 23, 1976; and U.S. Pat. No. 4,742,383 to Fitzgerald entitled "MULTI-FUNCTION FET MASTERSLICE CELL," May 3, 1988; both patents are assigned to the same assignee as the present application). Laser programming techniques involve customizing the metallization layers following their deposition (see, for example, Raffel et al., "A WAFER-SCALE DIGITAL INTEGRATOR USING RESTRUCTURABLE VSLI," IEEE Journal of Solid-State Circuits, Vol. SC-20, No. 1, February 1985, at pg. 399). Fusible links or antifuses can be employed and offer permanent (non-volatile) programming (see, for example, Millman, "MICROELECTRONICS," Mc-Graw-Hill, Inc., 1979, at pg. 196; and U.S. Pat. No. 4,758,745 to Elgamal et al. entitled "USER PROGRAMMABLE INTEGRATED CIRCUIT INTERCONNECT ARCHITECTURE AND TEST METHOD," Jul. 19, 1988). Erasable programmable read only memory ("EPROM") and electrically erasable programmable read only memory ("EEPROM") devices can be used and offer semi-permanent programming. EPROMS and EEPROMS are both electrically programmable and hold their states, even if power is removed. Special erase procedures can be used, however, to reconfigure the devices (see, for example, Wood et al., "AN ELECTRICALLY ALTERABLE PLA FOR FAST TURNAROUND TIME VLSI DEVELOPMENT HARDWARE," IEEE Journal of Solid-State Circuits, Vol. SC-16, No. 5, October 1981, at pg. 570). Finally, volatile random access memory ("RAM") devices are also available which are fully programmable and reprogrammable, but which lose their programmed state if power is removed (see, for example, U.S. Pat. No. 4,177,452 to Balasubramanian et al., Dec. 4, 1979, assigned to the same assignee as the present application). These and other techniques for programming arrays are known to those in the art and are also generally described in the publication entitled "FIELD-PROGRAMMABLE GATE ARRAYS" by S. Brown, R. Francis, J. Rose and Z. Vranesic, Kluwer Academic Publishers, 1992. Each of the above-named sources is hereby incorporated herein by reference in its entirety.

The preferred approach for programming arrays of the present invention involves SRAM memory cells, programmed by a user. The array can be configured in accordance with the techniques disclosed in the publication entitled "APPLICATION NOTE AT6000 SERIES CONFIGURATION", May 1993, Revision 1B, Atmel Corporation, which is hereby incorporated by reference in its entirety. The memory cells of the SRAM are allocated to the programmable resources of a field programmable gate array, FPGA, in accordance with an associated logic bit map.

When a field programmable gate array 90 (FPGA), with reference to FIG. 11, is incorporated within a computing system, the SRAM 92 for the FPGA is loaded with given configuration data for configuring the programmable resources of the FPGA. At power-up, configuration data of a data source 96 is downloaded from, for example an EEPROM, and loaded into the associated memory cells of the SRAM for driving the various programmable resources of the programmable gate array.

Alternatively, an external controller (not shown) is interfaced with the field programmable gate array for providing configuration data. Because test operations are not normally employed during functional operation of the FPGA, the configuration data associated with such tests is not included within a standard boot-up memory device. Instead, to provide the configuration data for enabling such test operations, an external controller, generally part of a quality assurance test system, addresses SRAM 92 of the field programmable gate array and loads the appropriate configuration data therein for configuring the interconnects and repeater latches, thus enabling testing as described hereinbefore. In addition, the external controller provides the necessary A,B, C-clocks for scanning data into or out of respective scan chains, and for capturing data into the appropriate scan chains. System clocks would be provided as necessary for functionally operating the various logic cells within a given configured logic circuit.

Accordingly, what has been disclosed is a programmable repeater latch for incorporation within select interconnects of a programmable gate array that enables isolation and testing of specific blocks of configured circuitry of the programmable gate array. In addition, the programmable repeater latch may alternatively be used as a functional element in functional cooperation with associated configured circuitry of the programmable gate array.

While the invention has been particularly shown and described with reference to preferred embodiments thereof, it will be understood by those skilled in the art that various other changes in form and details may be made therein without departing from the spirit and scope of the invention.

What is claimed is:

1. An integrated circuit having: a plurality of programmable logic cells, a programmable interconnect network for connecting the programmable logic cells, and at least one programmable interface circuit connected between an input interconnect lead and an output interconnect lead within said programmable interconnect network, said programmable interface circuit comprising:

an input node for carrying data into said programmable interface circuit from said input interconnect lead and an output node for carrying data from said programmable interface circuit to said output interconnect lead;

a circuit, connected between said input and output nodes, for selectively providing a buffered output signal to said output node, said buffered output signal being related to a logic state at said input node; and a signal storage circuit connected to said input node for selectively storing a logic state received from said input node.

2. An integrated circuit having a plurality of programmable logic cells, a programmable interconnect network for connecting the programmable logic cells, and at least one programmable interface circuit connected within said programmable interconnect network, said programmable interface circuit comprising:

an input node and an output node;

circuit, connected between said input and output nodes, for selectively providing a buffered output signal to said output node, said buffered output signal being related to a logic state at said input node; and a signal storage circuit connected to said input node for selectively storing a logic state received from said input node, wherein said programmable interface circuit further comprises a secondary input node and a secondary output node; and said signal storage circuit further comprises:

primary selective latch selectively coupled to said input node or said secondary input node for selectively storing a logic state received from either said input node or said secondary input node; and secondary selective latch selectively coupled to said primary selective latch and coupled to said secondary output node for providing latched data to said secondary output node, said latched data being representative of a previously stored logic state of said primary selective latch.

3. An integrated circuit according to claim 2 wherein said programmable interface circuit further comprises:

programmable driver selectively coupled to said output node for selectively providing data representative of said latched data to said output node.

4. An integrated circuit according to claim 1 wherein each of at least some of said plurality of programmable logic cells comprises a signal storage latch.

5. An integrated circuit according to claim 1 wherein said signal storage circuit is part of a scan chain.

6. An integrated circuit according to claim 1 further comprising:

first data source providing first configuration data for controlling the selectivity of said circuit; and second data source providing second configuration data for controlling the selectivity of said signal storage circuit.

7. An integrated circuit according to claim 1 wherein said programmable interface circuit further comprises:

a programmable driver coupled to said output node for selectively providing data representing the stored logic state to said output node and therefore to said output interconnect lead.

8. An integrated circuit having a plurality of programmable logic cells, a programmable interconnect network for connecting the programmable logic cells, and at least one programmable interface circuit connected within said programmable interconnect network, said programmable interface circuit comprising:

an input node and an output node;

a circuit, connected between said input and output nodes, for selectively providing a buffered output signal to said output node, said buffered output signal being related to a logic state at said input node; and a signal storage circuit connected to said input node for selectively storing a logic state received from said input node, wherein said integrated circuit further comprises a plurality of operational control signal paths and a plurality of test control signal paths, said integrated circuit further comprising:

programmable coupler selectively connecting at least one signal path of the group consisting of at least one select operational control signal path of said plurality of operational control signal paths and at least one select test control signal path of said plurality of test control signal paths to said signal storage circuit such that said signal storage circuit can be selectively employed during testing of said integrated circuit or during operation of said integrated circuit.

9. An integrated circuit having a plurality of programmable logic cells, a programmable interconnect network for connecting the programmable logic cells, and at least one programmable interface circuit connected within said programmable interconnect network, said programmable interface circuit comprising:

an input node and an output node;

a circuit, connected between said input and output nodes, for selectively providing a buffered output signal to said output node, said buffered output signal being related to a logic state at said input node; and a signal storage circuit connected to said input node for selectively storing a logic state received from said input node, wherein said signal storage circuit comprises:

a secondary input node for receiving serial input data;

a secondary output node for sending out serial output data;

primary and secondary latches retaining respective primary and secondary latched data;

a first selective coupler disposed between said input node and said primary latch, said first selective coupler selectively coupling primary data of said input node to said primary latch in accordance with a first clock signal so as to capture the primary data as said primary latched data;

a second selective coupler disposed between said secondary input node and said primary latch, said second selective coupler selectively coupling serial input data of said secondary input node to said primary latch in accordance with a second clock signal so as to capture the serial input data as said primary latched data; and a third selective coupler disposed between said primary latch and said secondary latch, said third selective coupler selectively coupling said primary latch to said secondary latch in accordance with a third clock signal so as to update the secondary latched data of said secondary latch in accordance with said primary latched data, data representative of the secondary latched data being provided at said secondary output node as serial output data.

10. An integrated circuit according to claim 9 wherein said signal storage circuit further comprises:

a programmable output means for selectively outputting to said output node an output signal representative of said secondary latched data;

the programmable output means selectively outputting said output signal in accordance with a first programmable select signal.

11. An integrated circuit according to claim 10 wherein said programmable output comprises a tri-state invertor having its input coupled to said secondary latch for receiving said secondary latched data, its tri-state enable coupled to be driven by said first programmable select signal, and its output coupled to said output node for providing said output signal when enabled per said first programmable select signal.

12. An integrated circuit according to claim 10 wherein said circuit connected between said input node and said output node, comprises a tri-state buffer having its input coupled to said input node, its output coupled to said output node, and its tri-state enable coupled to receive a second programmable select signal.

13. A method of operating an integrated circuit, comprising the steps of:

providing an integrated circuit having a plurality of programmable logic cells, a programmable interconnect network for connecting the programmable logic cells, a programmable buffer for selectively buffering a signal within a given programmable interconnect of the programmable interconnect network, and a signal storage circuit of a first serial scan chain for selectively capturing and storing data of, and providing data to, said given programmable interconnect;

configuring, as a configured logic circuit, select programmable logic cells of said plurality of logic cells and select programmable interconnects of said programmable interconnect network and including said given programmable interconnect, for implementing a desired logic design;

applying data to said configured logic circuit for stimulation thereof;

selectively operating said signal storage circuit for capturing data of said given programmable interconnect, as effected by processing of said configured logic circuit in response to stimulation by said data, into said signal storage circuit of said first scan chain; and scanning said captured data out of said first scan chain.

14. A method according to claim 13 wherein the integrated circuit also includes a second signal storage circuit of a second scan chain for receiving said data and selectively applying said data to said configured logic circuit; and said step of applying data to said configured logic circuit comprises scanning the data into said second scan chain and selectively operating said second signal storage circuit for transferring the data from said second signal storage circuit of said second scan chain to said configured logic circuit for stimulation thereof.

15. A method of operating an integrated circuit, comprising the steps of:

providing an integrated circuit having a plurality of programmable logic cells, a programmable interconnect network for connecting the programmable logic cells, a programmable buffer for selectively buffering a signal within a given programmable interconnect of the programmable interconnect network, and a signal storage circuit of a serial scan chain for selectively capturing and storing data from, and providing data to, said given programmable interconnect;

configuring, as a configured logic circuit, select programmable logic cells of said plurality of logic cells and select programmable interconnects of said programmable interconnect network and including said given programmable interconnect, for implementing a desired logic design;

scanning data serially into said signal storage circuit via said serial scan chain; and selectively operating said signal storage circuit for presenting said data to said given programmable interconnect as input data to the configured logic circuit.

16. A method according to claim 15, further comprising:

processing said input data per the configured logic circuit; and capturing output data as effected by said processing of the configured logic circuit, into a second signal storage circuit of a second serial scan chain.

17. A method of operating an integrated circuit, comprising the steps of:

providing an integrated circuit having a plurality of programmable logic circuits, a programmable interconnect network for connecting the programmable logic circuits, programmable buffers for selectively buffering associated signals within respective interconnects of the programmable interconnect network, and a plurality of signal storage circuits in parallel with respective programmable buffers for selectively capturing and storing data of associated said programmable interconnects or selectively outputting stored data thereof onto associated said programmable interconnects;

configuring, as a configured logic circuit, select programmable logic circuits of said plurality of logic circuits and select programmable interconnects of the programmable interconnect network, for implementing a desired logic design;

configuring first select signal storage circuits of said plurality of signal storage circuits as an input serial scan chain across at least one input line of said configured logic circuit;

configuring second select signal storage circuits of said plurality of signal storage circuits as an output serial scan chain across at least one output line of said configured logic circuit;

scanning data into said input serial scan chain;

selectively disabling the programmable buffer(s) of the select programmable interconnects as associated with said at least one input line of said configured logic circuit;

selectively enabling said first select signal storage circuit of said input serial scan chain to apply the data to said configured logic circuit;

processing the data by the configured logic circuit;

selectively operating said second select signal storage circuits of said output serial scan chain for capturing configured logic circuit output data at said at least one output line; and selectively operating said second select signal storage circuits of said output serial scan chain for scanning said captured data out of said output serial scan chain.

18. A programmable gate array, PGA, having a plurality of programmable logic circuits and a plurality of programmable interconnects, wherein at least one programmable interconnect of said plurality of programmable interconnects includes a programmable interface circuit disposed therein, said programmable interface circuit comprising:

a first node coupled to a first portion of said at least one programmable interconnect;

a second node coupled to a second portion said at least one programmable interconnect;

a programmable coupling circuit disposed between said first and second nodes for selectively propagating a signal therebetween in accordance with a first select signal; and an LSSD register disposed between said first and second nodes, said LSSD register having:

a primary input coupled to said first node for receiving primary data;

a serial input for receiving serial data;

first selective latch selectively coupled to said primary input or said serial input for selectively capturing, as captured data, either primary data of said primary input as effected by a pulse of a C-clock, or serial data of said serial input as effected by a pulse of an A-clock;

second selective latch selectively coupled to said first selective latch for latching data therein, as latched data, corresponding to said captured data of said first selective latch, the latching of said latched data being effected by a pulse of a B-clock;

a serial output for sending out serial output data corresponding to said latched data of said second selective latch; and a programmable primary output for selectively outputting to said second node primary output data corresponding to said latched data, the primary output data being selectively applied to said second node in accordance with a second select signal.

19. A PGA according to claim 18 wherein said programmable coupling circuit includes a tri-state buffer with its input coupled to said first node, its output coupled to said second node and its tri-state enable coupled to receive said first select signal.

20. A PGA according to claim 19 wherein said programmable coupling circuit further comprises a second tri-state buffer with its input coupled to said second node, its output coupled to said first node and its tri-state enable coupled to receive a third select signal.

21. A PGA according to claim 19 wherein said tri-state buffer comprises a tri-state inverter.

22. A PGA according to claim 19 wherein said programmable coupling circuit further comprises a pass gate disposed between said first node and said second node, said pass gate selectively coupling said first node to said second node in accordance with a third select signal.

23. A PGA according to claim 18 further comprising:

a plurality of memory cells associated with respective programmable resources of said PGA;

a first memory cell of said plurality of memory cells being associated with said programmable coupling circuit and providing said first select signal in accordance with data stored in said first memory cell; and a second memory cell of said plurality of memory cells being associated with said programmable primary output of said LSSD register and providing said second select signal in accordance with data stored in said second memory cell.

24. A programmed PGA according to claim 23 wherein said first memory cell has been loaded with data so as to configure said programmable coupling circuit to propagate a signal between said first and second nodes; and said second memory cell has been loaded with data so as to configure said programmable primary output of said LSSD register to apply the primary output data thereof to said second node.

25. A computing system employing a PGA according to claim 23, further comprising:

configuration means for providing predetermined first and second configuration data for storage as said associated stored data in said first and second memory cells respectively in accordance with desired configuration states of said programmable coupling circuit and said programmable primary output of said LSSD register.

26. A computing system according to claim 25 wherein said configuration means comprises a memory device of the group consisting of RAM, ROM, EPROM and EEPROM, said memory device having a data structure memory map allocated to the programmable resources of said PGA inclusive of said programmable coupling circuit and said programmable primary output of said LSSD register.

27. A PGA according to claim 18 wherein said programmable primary output of said LSSD register comprises a tri-state buffer having its output coupled to said second node, its input coupled to receive said latched data, and its tri-state enable coupled to receive said second select signal.

28. A PGA according to claim 18 wherein said LSSD register is one of a plurality of LSSD registers providing a serial scan chain, adjacent LSSD registers of said plurality of LSSD registers having respective serial inputs/outputs coupled to neighboring serial outputs/inputs, the plurality of LSSD registers of said serial scan chain sharing in common respective A, B, C-clocks, and receiving independent said second select signals for respective programmable primary outputs.

29. A PGA according to claim 18 further comprising:

a plurality of functional clock lines for propagating various system clock signals for clocking associated configured logic circuits of said plurality of programmable logic circuits during functional operation of said associated configured logic circuits;

a plurality of test clock lines for propagating test clock signals for clocking said LSSD register during testing of said PGA; and programmable selection means for alternatively coupling either at least one select functional clock line of said plurality of functional clock lines or at least one select test clock line of the plurality of test clock lines to said LSSD register as associated said A, B, C-clocks thereof, so that said LSSD register may be clocked by the associated at least one functional clock signal during functional operation of said PGA or alternatively clocked by the associated at least one test clock signal during testing of said PGA.

30. A PGA according to claim 29 wherein the programmable selection means selectively provides the C and B clocks of said LSSD register.

31. A PGA according to claim 29 wherein the programmable selection means comprises a multiplexer.

* * * * *